United States Patent
Jung et al.

(10) Patent No.: US 7,875,978 B2
(45) Date of Patent: Jan. 25, 2011

(54) METAL LINE HAVING A MULTI-LAYERED DIFFUSION LAYER IN A SEMICONDUCTOR DEVICE AND METHOD FOR FORMING THE SAME

(75) Inventors: Dong Ha Jung, Gyeonggi-do (KR); Seung Jin Yeom, Gyeonggi-do (KR); Baek Mann Kim, Gyeonggi-do (KR); Joon Seok Oh, Gyeonggi-do (KR); Nam Yeal Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/485,473

(22) Filed: Jun. 16, 2009

(65) Prior Publication Data

US 2010/0052168 A1    Mar. 4, 2010

(30) Foreign Application Priority Data

Aug. 29, 2008 (KR) .................. 10-2008-0085388

(51) Int. Cl.
*H01L 23/48* (2006.01)
*H01L 23/52* (2006.01)
*H01L 29/40* (2006.01)

(52) U.S. Cl. .............. 257/751; 438/627; 257/E23.163; 257/E21.584

(58) Field of Classification Search .............. 438/627; 257/751, E23.163, E21.584
See application file for complete search history.

(56) References Cited

U.S. PATENT DOCUMENTS

2010/0038785 A1* 2/2010 Cheng et al. ........... 257/751

FOREIGN PATENT DOCUMENTS

| JP | 2003-017437 A | 1/2003 |
| KR | 1020070056126 A | 5/2007 |

* cited by examiner

*Primary Examiner*—Jarrett J Stark
(74) *Attorney, Agent, or Firm*—Ladas & Parry LLP

(57) ABSTRACT

A metal line having a multi-layered diffusion layer in a resultant semiconductor device is presented along with corresponding methods of forming the same. The metal line includes an insulation layer, a multi-layered diffusion barrier, and a metal layer. The insulation layer is formed on a semiconductor substrate and has a metal line forming region. The multi-layered diffusion barrier is formed on a surface of the metal line forming region defined in the insulation layer. The diffusion barrier includes a $VB_2$ layer, a CrV layer and a Cr layer. The metal layer is formed on the diffusion barrier which substantially fills in the metal line forming region of the insulation layer to eventually form the metal line.

19 Claims, 4 Drawing Sheets

METAL LINE HAVING A MULTI-LAYERED DIFFUSION LAYER IN A SEMICONDUCTOR DEVICE AND METHOD FOR FORMING THE SAME

CROSS-REFERENCE TO RELATED APPLICATIONS

The present application claims priority to Korean patent application number 10-2008-0085388 filed on Aug. 29, 2008, which is incorporated herein by reference in its entirety.

BACKGROUND OF THE INVENTION

The present invention relates to metal lines in semiconductor devices and to methods for forming the same, and more particularly, to a metal line having a multi-layered diffusion barrier that has a decreased resistance as well has a desirable characteristic in preventing constituents in the metal line, such as copper, from diffusing beyond the bounds of the diffusion barrier.

Generally, metal lines are formed in a semiconductor device to electrically connect together elements or lines with each other. Contact plugs are formed to electrically connect lower metal lines and upper metal lines to each other. As the high integration of a semiconductor device continues to proceed, the aspect ratios of a contact hole in which a contact plug is to be formed gradually increases. As a result, the process for forming metal lines and contact plugs become more difficult because these diminutive metal lines and contact plugs must also maintain their physical and performance characteristics such as assuring that unwanted impurities do not diffuse past their corresponding barriers.

Aluminum and tungsten have been mainly used as conductive materials in the metal lines of a semiconductor device because they exhibit relatively good electrical conductivity properties and because they do not tend towards adversely affecting the performance of the resultant semiconductor device due to unwanted diffusion away from these metal lines. Recently, research has been made in the hopes of using copper as a next-generation material for a metal line because copper exhibits superior electrical conductivity and low resistance as compared to aluminum and tungsten. Copper (Cu) can therefore solve or at least aid in minimizing the problems associated with RC (resistance-capacitance) signal delay in the semiconductor device having a high level of integration and high operating speed.

It is known that copper diffuses very fast through semiconductor substrates and through insulation layers. Further the diffused copper is known to act as a deep-level impurity in the semiconductor substrate made of silicon and can induce leakage currents. Therefore, it is necessary to form a diffusion barrier at an interface between a copper layer acting as a metal line and the surrounding insulation layer.

Hereinbelow, a conventional method for forming a metal line of a semiconductor device will be briefly described.

After forming an insulation layer on a semiconductor substrate, a metal line forming region is defined by etching the insulation layer. Then, a diffusion barrier is formed on the insulation layer and on the surface of the metal line forming region, and a copper seed layer is subsequently formed on the diffusion barrier. Next, after forming a copper layer on the copper seed layer, by CMPing (chemically and mechanically polishing) the copper layer, a metal line comprising the copper layer is formed.

However, in the conventional art described above, as the size of cells decreases in conformity with the trend toward higher integration of these semiconductor devices, it is becoming more and more difficult to properly prevent the diffusion of a copper constituent by means of the diffusion barrier formed via the conventional arts.

Also, in the conventional art described above, it is difficult or even impossible to increase the thickness of the diffusion barrier so as to improve the characteristics of the diffusion barrier because of the design constraints of these diminutive structures. Due to this fact, the performance characteristics of the diffusion barrier are likely to deteriorate, and the resistance of the metal lines are likely to increase. As a result, in the conventional art described above, the characteristics and the reliability of a semiconductor device, including the characteristics of a metal line, are likely to deteriorate.

BRIEF SUMMARY OF THE INVENTION

Embodiments of the present invention are directed to a metal line of a semiconductor device that has a lowered resistance and has improved diffusion barrier characteristics and directed to methods for forming the same.

Embodiments of the present invention are also directed to a metal line of a semiconductor device which can improve the characteristics and the reliability of a semiconductor device and a method for forming the same.

In one aspect of the present invention, a metal line of a semiconductor device comprises an insulation layer formed on a semiconductor substrate which has a metal line forming region; a diffusion barrier formed on a surface of the metal line forming region defined in the insulation layer, and has a multi-layered structure of a $VB_2$ (vanadium diboride) layer, a CrV (chromium vanadium) layer and a Cr (chromium) layer; and a metal layer formed on the diffusion barrier which substantially fills in the metal line forming region of the insulation layer.

A preferred embodiment is that the metal layer comprises a copper layer.

In another aspect of the present invention, a method for forming a metal line of a semiconductor device comprises the steps of forming an insulation layer on a semiconductor substrate to have a metal line forming region; forming a diffusion barrier on the insulation layer including a surface of the metal line forming region to have a multi-layered structure of a $VB_2$ layer, a CrV layer and a Cr layer; and forming a metal layer on the diffusion barrier to substantially fill in the metal line forming region.

The step of forming the diffusion barrier comprises the steps of forming a V-rich $V_xB_{1-x}$ layer on the insulation layer including a surface of the metal line forming region; forming a Cr layer on the V-rich $V_xB_{1-x}$ layer; and annealing the resultant semiconductor substrate which is formed with the Cr layer, and thereby forming a CrV layer between the V-rich $V_xB_{1-x}$ layer and the Cr layer and converting the V-rich $V_xB_{1-x}$ layer into a $VB_2$ layer.

In the V-rich $V_xB_{1-x}$ layer, the x subscript is preferably in a range of between about 0.4~0.6.

Annealing is conducted at a temperature of preferably between about 500~800° C.

Annealing is conducted preferably between about 0.5~6 hours.

The metal layer comprises a copper layer.

DESCRIPTION OF SPECIFIC EMBODIMENTS

In the present invention, when forming a metal line using a copper layer, a diffusion barrier, which has the multi-layered structure of a $VB_2$ layer, a CrV layer and a Cr layer, is formed between an insulation layer and the copper layer. Since the $VB_2$ layer and the CrV layer of the diffusion barrier have excellent characteristics, in the present invention, the diffusion of a copper constituent can be effectively prevented even without increasing the thickness of the diffusion barrier. Accordingly, in the present invention, the proportion of the copper layer in the metal line can be increased so that the resistance of the metal line can be decreased. Through this, the characteristics and the reliability of a semiconductor device, including the characteristics of the metal line, can be improved.

In detail, the copper constituent of the copper layer has very low solid solubility less than several percent with respect to a V constituent, and the V constituent of the $VB_2$ layer and the CrV layer has little or no solid solubility with respect to the copper constituent. Also, the copper constituent has little or no solid solubility with respect to the Cr constituent of the CrV layer and the Cr layer, and the Cr constituent has solid solubility less than 0.4 percent at about 1,000° C. and less than 0.1 percent at about 400° C. with respect to the copper constituent.

Therefore, in the present invention, the diffusion of the copper constituent can be effectively prevented by using a multi-layered diffusion barrier comprising a $VB_2$ layer, a CrV layer and a Cr layer which contain the V constituent and/or the Cr constituent, whereby the characteristics of the diffusion barrier can be improved.

Further, due to the fact that the Cr layer of the diffusion barrier has specific resistance of 12.9 μΩcm, the Cr layer can also serve as a seed layer when subsequently forming the copper layer through electroplating. Accordingly, in the present invention, because it is not necessary to additionally deposit a copper seed layer or an ALD-Ru layer on the diffusion barrier, the present invention can be applied to manufacturing highly integrated semiconductor devices having fine widths.

Hereafter, specific embodiments of the present invention will be described in detail with reference to the attached drawings.

Figure 1:
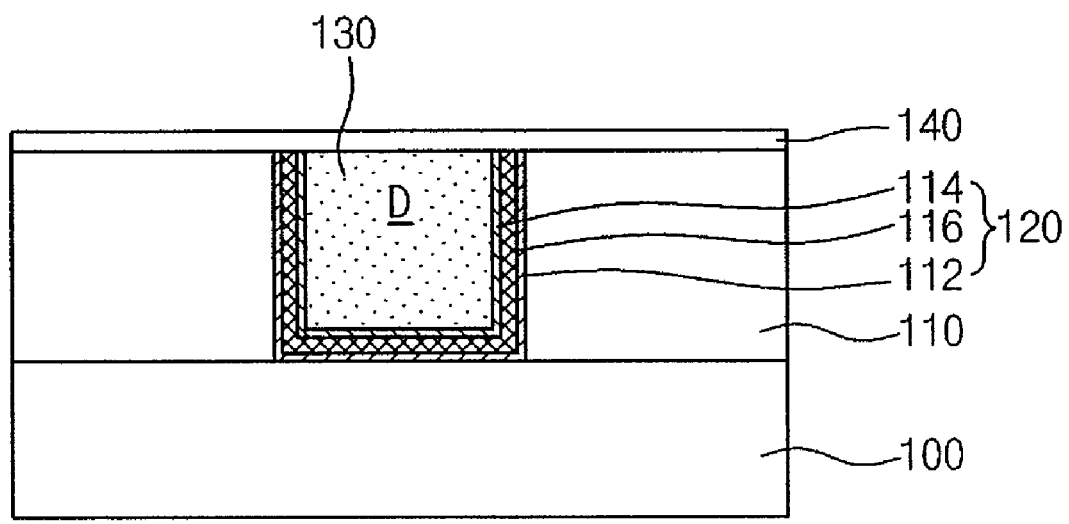
FIG. 1 is a sectional view illustrating a metal line of a semiconductor device in accordance with an embodiment of the present invention.

FIG. 1 depicts a sectional view illustrating a metal line of a semiconductor device in accordance with an embodiment of the present invention.

Referring to FIG. 1, an insulation layer 110 is formed on a semiconductor substrate 100 which is formed with a predetermined understructure (not shown). The insulation layer 110 is shown having a metal line forming region D. The metal line forming region D can be defined by any of the well known procedures such as by using a single damascene process or by using a dual damascene process. The metal line forming region D can have any structural configuration such as having a trench structure or a trench and via-hole structure which has a trench and at least one via-hole communicating with the trench. While not shown in a drawing, it is understood herein that the insulation layer 110 can be a single layer or be composed of a plurality of layers such as being comprised of a stack structure of first and second insulation layers. In this case of a stack structure of first and second insulation layers, an etch stop layer is preferably formed between the first and second insulation layers. The etch stop layer may comprise any of the etch stop layers such as, for example, an SiN layer.

A diffusion barrier 120 is formed on the surface of the metal line forming region D which is defined in the insulation layer 110, to be a multi-layered structure comprising a $VB_2$ layer 112, a CrV layer 116 on the $VB_2$ layer 112, and a Cr layer 114 on the CrV layer 116. The structure of the CrV layer 116 of the diffusion barrier 120 is composed of nanograins. The stoichiometric ratios of the CrV layer 116 vary and comprises a $Cr_xV_y$ layer, where $0.4 \leq x \leq 0.6$, and $0.4 \leq y \leq 0.6$.

A metal line 130 is formed on the diffusion barrier 120 to fill the metal line forming region D. The metal line 130 comprises a copper layer. A capping layer 140 is formed on the insulation layer 110 including the metal line 130.

In the metal line 130 according to the embodiment of the present invention it is possible to prevent or at least minimize the occurrence that the constituent of the copper layer will substantially diffuse into the insulation layer 110. It is thought that this is due to the fact that the multi-layered structure diffusion barrier 120, has an amorphous $VB_2$ layer 112 and an amorphous CrV layer 116 which do not have any grain boundaries and an ordered crystalline Cr layer 114, is formed between the copper layer and the insulation layer 110. Accordingly, in the present invention, the performance characteristics of the diffusion barrier 120 can be improved which minimizes copper from escaping from the metal line 130 and thus minimizes unwanted copper diffusion into the semiconductor device. Therefore, the characteristics and the reliability of a semiconductor device can be substantially improved.

FIGS. 2A through 2F depict sectional views illustrating some of the processes of a method for forming a metal line of a semiconductor device in accordance with another embodiment of the present invention.

Figure 2A:
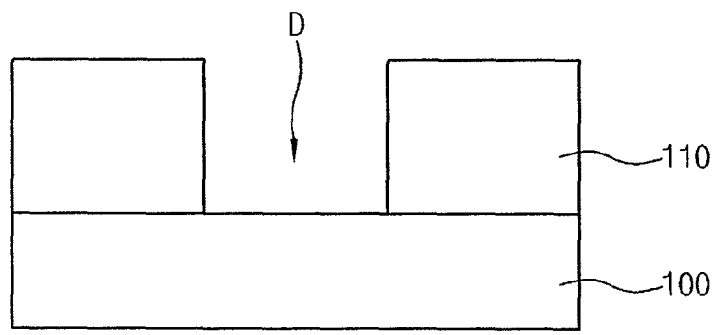
FIGS. 2A through 2F are sectional views illustrating the processes of a method for forming a metal line of a semiconductor device in accordance with another embodiment of the present invention.

Referring to FIG. 2A, an insulation layer 110 is formed on a semiconductor substrate 100 which is formed with a predetermined understructure (not shown), in such a way as to cover the understructure. A metal line forming region D is defined by etching the insulation layer 110. The metal line forming region D is defined by any number of techniques such as using a single damascene process or a dual damascene process. The metal line forming region may have any number of structural features such as having a trench structure or a trench and via-hole structure which has a trench and at least one via-hole communicating with the trench.

Figure 2B:
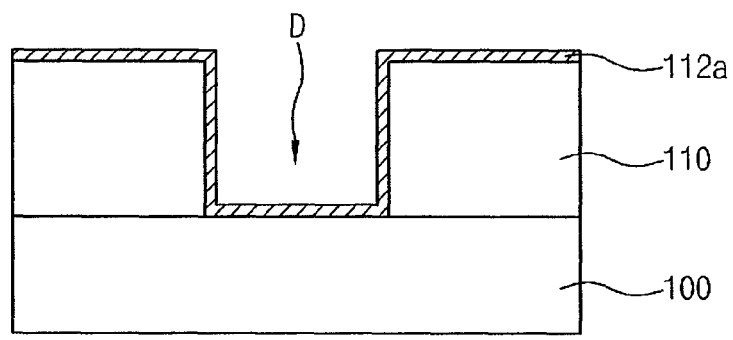

Referring to FIG. 2B, a V-rich $V_xB_{1-x}$ layer 112a is then formed on the insulation layer 110 and on the surface of the metal line forming region D. The V-rich $V_xB_{1-x}$ layer 112a may be formed by any number of fabrication schemes such as those using CVD (chemical vapor deposition) or PVD (physical vapor deposition). The formed $V_xB_{1-x}$ layer 112a has an amorphous configuration solid phase. The stoichiometric ratios of the V-rich $V_xB_{1-x}$ layer 112a may be any known range, and preferably the x subscript has a range of about 0.4~0.6.

Figure 2C:
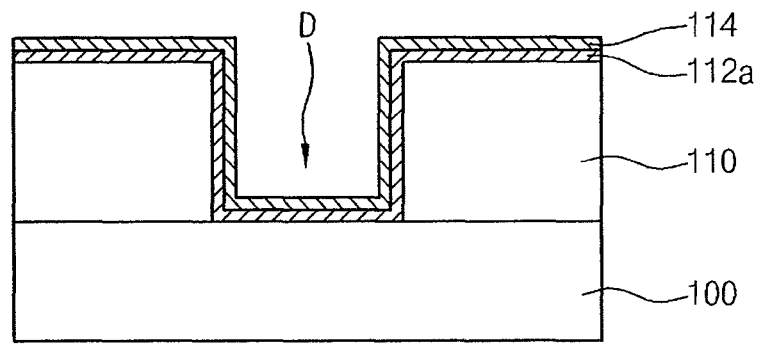

Referring to FIG. 2C, a Cr layer 114 is then subsequently formed on the V-rich $V_xB_{1-x}$ layer 112a. The Cr layer 114 may be formed using any known fabrication method such as using PVD or CVD.

Figure 2D:
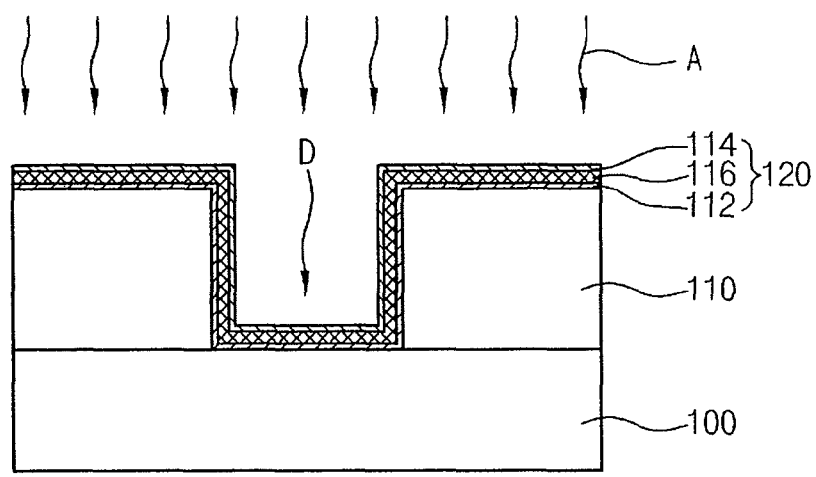

Referring to FIG. 2D, the resultant semiconductor substrate 100 is annealed so that the V-rich $V_xB_{1-x}$ layer 112a and the Cr layer 114 react with each other. The annealing may be conducted in a broad range of temperature, time and ambient atmosphere conditions. It is preferred that the annealing be conducted at a temperature of between about 500~800° C. for between about 0.5~6 hours, preferably, under an inert atmosphere such as a $N_2$ atmosphere.

By conducting the annealing, the V-rich $V_xB_{1-x}$ layer 112a and the Cr layer 114 react with each other, and a CrV layer 116 is subsequently formed at the interface therebetween. As a result, a diffusion barrier 120, which has a multi-layered structure of a $VB_2$ layer 112, the CrV layer 116 and the Cr layer 114, is formed on the insulation layer 110 and form on the surface of the metal line forming region D. In this regard, by conducting the annealing, the V-rich $V_xB_{1-x}$ layer 112a is converted into the $VB_2$ layer 112. The CrV layer 116 is formed as a nanograined layer which has a grain size corresponding to a nanosize. The stoichiometric ratios of the resultant CrV layer 116 comprises, for example, a $Cr_xV_y$ layer ($0.4 \leq x \leq 0.6$, and $0.4 \leq y \leq 0.6$).

The V constituent and the Cr constituent of the diffusion barrier 120 have little or no solid solubility with respect to a copper, and the copper constituent has little or no solid solubility with respect to the V constituent and the Cr constituent. Accordingly, the multi-layered diffusion barrier 120 having the structure of the $VB_2$ layer 112, the CrV layer 116 on the $VB_2$ layer 112 and the Cr layer 114 on the CrV layer 116 can effectively prevent the diffusion of a copper layer contained within the confines of the multi-layered diffusion barrier 120.

Figure 2E:
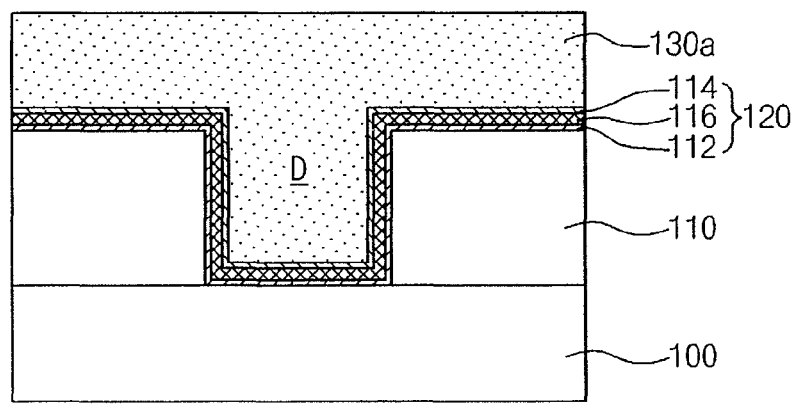

Referring to FIG. 2E, a metal layer 130a is formed on the diffusion barrier 120 to fill the metal line forming region D. The metal layer 130a preferably comprises a copper layer. The copper layer is formed through, for example, electroplating.

Since the Cr layer 114 of the diffusion barrier 120 has specific resistance of about 12.9 μΩcm and it can also serve as a seed layer when forming the copper layer through electroplating. Accordingly, in the present invention it is not necessary to additionally deposit a seed layer on the diffusion barrier 120. Accordingly, the present invention provides a number of advantages when it is used to manufacture highly integrated semiconductor devices having fine widths.

Figure 2F:
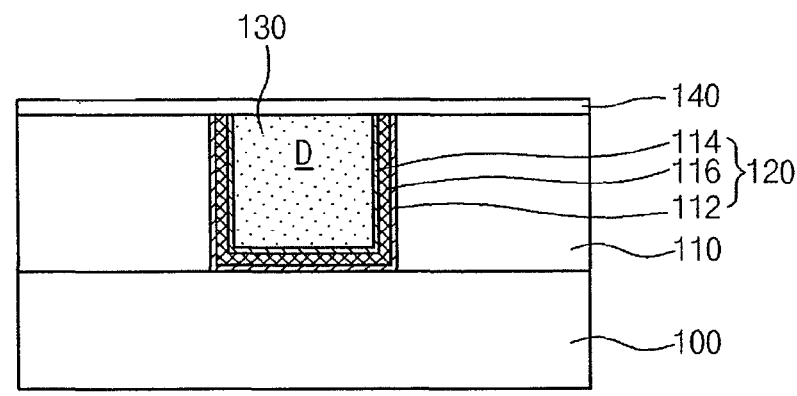

Referring to FIG. 2F, by CMPing the metal layer 130a and the diffusion barrier 120 until the insulation layer 110 is exposed, a metal line 130 is subsequently formed which substantially fills in the metal line forming region D. A capping layer 140 is then formed on the insulation layer 110 in which the metal line 130 is formed.

Thereafter, while not shown in a drawing, by sequentially conducting a series of well-known subsequent processes, the formation of the metal line of a semiconductor device according to the embodiment of the present invention is completed.

As is apparent from the above description, in the present invention, due to the fact that the diffusion barrier of a metal line is constituted by an amorphous $VB_2$ layer, an amorphous CrV layer and a crystalline Cr layer, the performance characteristics of the diffusion barrier can be improved while not increasing the thickness of the diffusion barrier as compared to the conventional art. Through this, it is possible to prevent or at least minimize the occurrence of copper from diffusing away into an insulation layer. Accordingly, in the present invention, the characteristics and the reliability of a resultant semiconductor device can be improved.

Further, in the present invention, since the Cr layer of the diffusion barrier can serve as a seed layer when forming the copper layer, it is not necessary to additionally deposit a seed layer on the diffusion barrier. Accordingly, the present invention can be advantageously applied when manufacturing highly integrated semiconductor devices that have fine line widths.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A metal line of a semiconductor device, comprising:
   an insulation layer formed on a semiconductor substrate and having a metal line forming region;
   a multi-layered diffusion barrier formed on a surface of the metal line forming region, the diffusion barrier comprising
   a $VB_2$ layer,
   a CrV layer on the $VB_2$ layer, and
   a Cr layer on the CrV layer; and
   a metal layer formed on the diffusion barrier substantially filling in the metal line forming region of the insulation layer.

2. The metal line according to claim 1, further comprising a capping layer over the metal layer.

3. The metal line according to claim 1, wherein the metal layer comprises a copper layer.

4. The metal line according to claim 1, wherein the $VB_2$ layer is amorphous.

5. The metal line according to claim 1, wherein the CrV layer is amorphous.

6. The metal line according to claim 1, wherein the Cr layer is ordered crystalline.

7. The metal line according to claim 1, wherein the $VB_2$ layer has a stoichiometry comprising $V_xB_{1-x}$ in which the x subscript has a range of about 0.4~0.6.

8. The metal line according to claim 1, wherein the CrV layer has a stoichiometry comprising $Cr_xV_y$ in which the x subscript is between about 0.4 and 0.6, and the y subscript is between about 0.4 and 0.6.

9. A method for forming a metal line of a semiconductor device, comprising the steps of:
   forming an insulation layer on a semiconductor substrate to have a metal line forming region;
   forming a multi-layered diffusion barrier on the insulation layer and on a surface of the metal line forming region, the diffusion barrier comprising a $VB_2$ layer, a CrV layer on the $VB_2$ layer and a Cr layer on the CrV layer; and
   forming a metal layer on the diffusion barrier to substantially fill in the metal line forming region.

10. The method according to claim 9, further comprising forming a capping layer over the metal layer.

11. The method according to claim 9, wherein the step of forming the diffusion barrier comprises the steps of:
   forming a V-rich $V_xB_{1-x}$ layer on the insulation layer and on a surface of the metal line forming region;
   forming a Cr layer on the V-rich $V_xB_{1-x}$ layer; and
   annealing the resultant semiconductor substrate which is formed with the Cr layer, and thereby forming a CrV layer between the V-rich $V_xB_{1-x}$ layer and the Cr layer and converting the V-rich $V_xB_{1-x}$ layer into a $VB_2$ layer.

12. The method according to claim 11, wherein, in the V-rich $V_xB_{1-x}$ layer, the x subscript has a range of between about 0.4~0.6.

13. The method according to claim 11, wherein annealing is conducted at a temperature of between about 500~800° C.

14. The method according to claim 11, wherein annealing is conducted between about 0.5~6 hours.

15. The method according to claim 9, wherein the metal layer comprises a copper layer.

16. The method according to claim 9, wherein the CrV layer has a stoichiometry comprising $Cr_xV_y$ in which the x subscript is between about 0.4 and 0.6, and the y subscript is between about 0.4 and 0.6.

17. The method according to claim 9, wherein the $VB_2$ layer is amorphous.

18. The method according to claim 9, wherein the CrV layer is amorphous.

19. The method according to claim 9, wherein the Cr layer is ordered crystalline.

* * * * *